(12) United States Patent
Katsuyama

(10) Patent No.: US 8,021,985 B2
(45) Date of Patent: Sep. 20, 2011

(54) METHOD TO FORM SEMICONDUCTOR LASER DIODE

(75) Inventor: Tomokazu Katsuyama, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 12/971,689

(22) Filed: Dec. 17, 2010

(65) Prior Publication Data

US 2011/0159620 A1    Jun. 30, 2011

(30) Foreign Application Priority Data

Dec. 24, 2009  (JP) ................. 2009-292905

(51) Int. Cl.
*H01L 21/302* (2006.01)
(52) U.S. Cl. ........ 438/717; 438/551; 438/671; 438/689; 438/706
(58) Field of Classification Search .......... 438/448, 438/551, 671, 689, 706, 717
See application file for complete search history.

(56) References Cited

U.S. PATENT DOCUMENTS

| 5,822,349 A | 10/1998 | Takaoka et al. | |
| 6,461,969 B1 * | 10/2002 | Lee et al. | 438/706 |
| 2010/0190283 A1 * | 7/2010 | Katsuyama | 438/39 |

FOREIGN PATENT DOCUMENTS

| JP | 8-250808 | 9/1996 |
| JP | 10-256669 | 9/1998 |

* cited by examiner

*Primary Examiner* — Dung A. Le
(74) *Attorney, Agent, or Firm* — Smith, Gambrell & Russell, LLP

(57) ABSTRACT

The process of the present invention to form a mask made of inorganic material containing silicon reduces the plasma damage induced in the semiconductor layers due to the plasma-ashing. The semiconductor material is heat-treated at a high temperature after the growth thereof to form an oxide layer positively in the surface of the semiconductor material before it is covered by the silicon inorganic film. This inorganic film is dry-etched by an etchant containing fluorine to get a mask for forming a mesa and for growing burying layer selectively.

18 Claims, 6 Drawing Sheets

METHOD TO FORM SEMICONDUCTOR LASER DIODE

CROSS REFERENCE TO RELATED APPLICATIONS

The present application is related to the following commonly-assigned U.S. patent application: U.S. Ser. No. 12/692,177, entitled: METHOD TO FORM SEMICONDCUTOR LASER DIODE WITH MESA STRUCTURE BURIED BY CURRENT BLOCKING LAYER; incorporated herein as a part hereof.

BACKGROUND OF THE INVENTION

1. Field of the Invention

The present invention relates to a method to form a semiconductor laser diode (hereafter denoted as LD), in particular, the invention relates to a process of the LD with a mesa structure buried by a current blocking layer.

2. Relater Prior Art

Japanese Patent Application published as JP-H10-256669β has disclosed a semiconductor laser diode (hereafter denoted as LD) integrated with an optical modulator. A process to form the LD disclosed therein uses a reactive ion etching (hereafter denoted as RIE) technique and so on to form a ridge waveguide structure. A metal organic chemical vapor deposition (hereafter denoted as MOCVD) may grow in both sides of the ridge waveguide structure a burying layer made of iron (Fe)-doped InP and a hole-trapping layer made of InAlAs. Then, a contact layer made of InGaAs is grown on the ridge waveguide structure, the Fe-doped InP burying layer and the hole-trapping layer.

The ridge waveguide structure may be formed by etching a semiconductor stack including an active layer and occasionally an optical confinement layer, and by burying the thus formed ridge, often called as a mesa, by growing the burying layer selectively only in both sides of the mesa. These etching and selective growing is necessary to use a mask often made of inorganic material containing silicon (Si), typically silicon die-oxide ($SiO_2$) or silicon nitride (SiN).

The mask mentioned above may be formed by forming the inorganic material on the semiconductor stack and selectively etching the inorganic material so as to leave a portion corresponding to the mesa. Dry-etching using etchant containing fluorine, such as trifluoromethane ($CHF_3$), may be applicable to form the mask.

SUMMARY OF THE INVENTION

However, when the inorganic material containing Si is dry-etched by an etchant containing Si, many residuals of carbon fluoride are left on a surface of the semiconductor stack exposed by the etching. Because such residuals of carbon fluoride often disturb the subsequent etching of the semiconductor material, the plasma-ashing using oxygen plasma is inevitable to remove such residuals of carbon fluoride after the formation of the mask. But excess plasma-ashing causes a serious damage on the surface of the semiconductor material. The LD involves an active layer in the semiconductor stack and the plasma damage mentioned above is sometimes affected to the active layer even the active layer exists in a deep of the stack. Damaged active layer degrades the reliability of the device.

One aspect of the present invention relates to a method of manufacturing a semiconductor device according to the present invention includes steps of: (a) growing a semiconductor layer on a semiconductor substrate; (b) oxidizing the semiconductor layer; (c) covering the semiconductor layer by an inorganic material containing silicon; (d) forming a striped mask in the inorganic material, which includes steps of dry-etching the inorganic material by an etchant containing fluorine (F) using a photoresist pattern as an etching mask and plasma-ashing the photoresist pattern; and (e) etching the semiconductor layer using the striped mask of the inorganic material. The step of oxidizing includes a step of heat-treating the semiconductor layer in an atmosphere including oxygen.

The process of the present invention has a feature that the semiconductor layer is positively oxidized in an atmosphere including oxygen after the growth to form an oxide layer in a surface thereof. This oxide layer will be exposed at a subsequent process to form the etching mask made of inorganic material containing Si and the exposed oxide layer may easily react with an etchant containing fluorine (F), which may form a material with high volatility such as carbonyl fluoride ($COF2$) and suppress the creation of the residual of carbon fluoride. Accordingly, the plasma-asking using oxygen plasma may be shortened or sometimes may be cut in the process.

Another feature of the present invention relates to a method to manufacture an LD. The LD may include an active layer containing aluminum (Al) and a ridge waveguide structure with a mesa shape. The process of the invention may include steps of: (a) growing a semiconductor stack that includes a plurality of semiconductor layers on the InP substrate; (b) oxidizing the semiconductor stack by heat-treating the semiconductor stack in an atmosphere including oxygen to form a oxidized layer; (c) forming a striped mask made of inorganic material containing Si on the semiconductor stack by (c-1) dry-etching the inorganic material by an etchant containing fluorine (F) using a photoresist pattern as an etching mask, and (c-2) plasma-etching the photoresist pattern; (d) iterating dry-etching the semiconductor stack and subsequent plasma-ashing alternately using the striped mask as the etching mask to from the ridge waveguide structure in the semiconductor stack; and (e) burying the ridge waveguide structure by a burying layer.

A feature of the process for the LD is that the semiconductor stack is positively oxidized after the growth thereof under a condition of a temperature of equal to or higher than 100° C., or equal to or less than 400° C. in an atmosphere including oxygen. The etching of the inorganic material may be carried out by an etchant of a mixture of fluorine (F), carbon (C), and hydrogen (H), where one of such etchant is $CHF_3$, while the plasma-ashing to remove the photoresist pattern may be carried out by a mixture of tetra fluoride ($CF_4$) and oxygen ($O_2$). Because the step of oxidizing may convert the surface of the semiconductor stack, a formation of residual of carbon fluoride may be reduced in the process of the etching and the subsequent plasma-ashing. In particular, when the semiconductor stack includes a cap layer made of at least InGaAs and InP in the top thereof, such cap layer is likely to create the residuals of carbon fluoride at the etching using a fluorine containing etchant. The process according to the present invention forms the oxide layer in to surface of the cap layer; the residuals of carbon fluoride may be effectively reduced.

Because the method according to the present invention may suppress the creation of the residuals of carbon fluoride, the plasma-ashing subsequent to the dry-etching may be shortened, which may reduce the plasma damage likely to be introduced in the semiconductor materials exposed to the plasma. Accordingly, even the semiconductor stack includes the active layer containing aluminum (Al), which is easily affected by the plasma; the active layer may be reduced of free from the plasma damage.

BRIEF DESCRIPTION OF DRAWINGS

The foregoing and other purposes, aspects and advantages will be better understood from the following detailed description of a preferred embodiment of the invention with reference to the drawings, in which.

DETAILED DESCRIPTION OF PREFERRED EMBODIMENTS

Figure 1A:
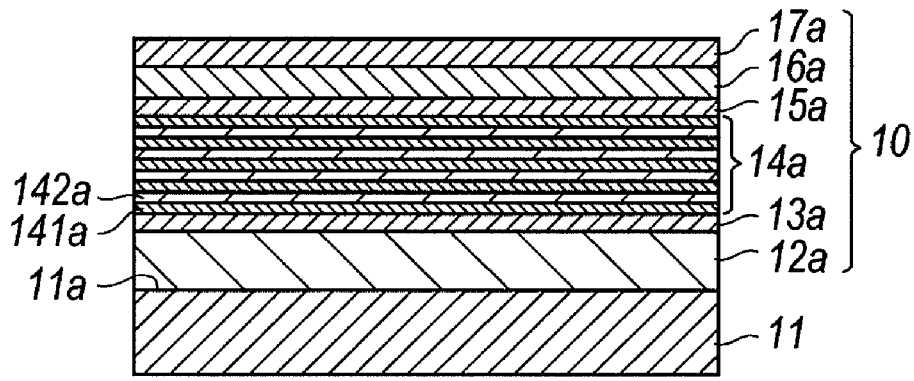
FIGS. 1A to 1C illustrate processes for the LD according to an embodiment of the present invention.

Next, some preferred embodiments according to the present invention will be described as referring to accompanying drawings. In the description of the drawings, the same or like elements will be referred by the same or like numerals or symbols without overlapping explanations.

First Embodiment

A process to manufacture a semiconductor laser diode (hereafter denoted as LD) according to an embodiment of the present invention will be described as referring to FIGS. 1 to 4. Semiconductor layers introduced in the description below may be formed by the metal organized vapor phase epitaxy (hereafter denoted as MOVPE) technique. The MOVPE uses tri-methyl-gallium (TMGa), tri-methyl-indium (TMIn), phosphine ($PH_3$), and arsine ($ArH_3$) for sources of gallium (Ga), indium (In), phosphorous (P), and arsenic (As), respectively. A di-ethyle-zinc (DEZn) and a mono-silane ($SiH_4$) are used for a p-type dopant and an n-type dopant, respectively.

Formation of Layer Stack

A plurality of semiconductor layers, 12a to 17a, is grown on a primary surface 11 of an n-type InP substrate 11. These layers are provided for an active region. Specifically, the layer 12a is for the buffer layer, the layer 13a is provided for the lower optical confinement layer, the layer 14a is provided for the active layer, the layer 15a is for the upper optical confinement layer, the layer 16a is for the upper cladding layer, and the layer 17a is for the cap layer. Thus, the semiconductor stack 10 is formed on the n-type InP substrate 11. The layer 17a for the cap layer is the topmost layer of the stack 10.

The layer 12a for the buffer layer may be made of Si-doped InP film with a thickness of 550 nm and a carrier concentration of about $1.1 \times 10^{18}$ $cm^{-3}$. The layers, 13a and 15a, for the lower and upper optical confinement layer may be made of AlGaInAs film with a bandgap wavelength of 1000 nm and a thickness of about 40 nm. The bandgap wavelength corresponds to a wavelength at which the luminescence becomes the maximum and inversely proportional to the bandgap energy of the semiconductor material.

The layer 14a for the active layer may be made of AlGaInAs and have the multiple quantum well (MQW) structure with a plurality of barrier layers 141a and a plurality of well layers 142a alternately stacked to each other. The barrier layer 141a may have a bandgap wavelength of 1310 nm and a thickness of, for instance, 8 nm; while, the well layer 142a may have the bandgap wavelength of 1310 nm and a thickness of, for instance, 5 nm. A lattice miss-matching between the barrier layer 141a and the well layer 142a is, for instance, 1.0%, which may induce compressive stress in the well layers, while, tensile stress in the barrier layers.

The layer 16a for the upper cladding layer may be made of Zn-doped InP film with a thickness of 150 nm and a carrier concentration of $1.0 \times 10^{18}$ $cm^{-3}$. The layer 17a for the cap layer may be made of Zn-doped InGaAs with a thickness of 100 nm and a carrier concentration of $1.5 \times 10^{18}$ $cm^{-3}$.

A periodic structure for an optical grating may be introduced in the interface between the layer 15a for the upper optical confinement layer and the layer 16a for the upper cladding layer. In this process, the layers, 12a to 15a, are firstly grown on the n-type InP substrate 11, then, forms the periodic structure in the layer 15a and lastly, two layers, 16a and 17a, are grown on the layer 15a.

Oxidization of Surface

Figure 1B:
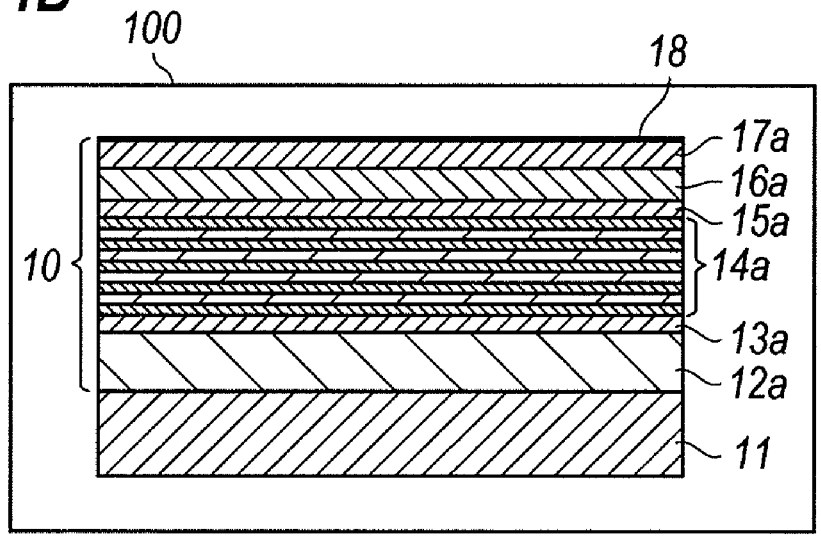
Figure 1C:
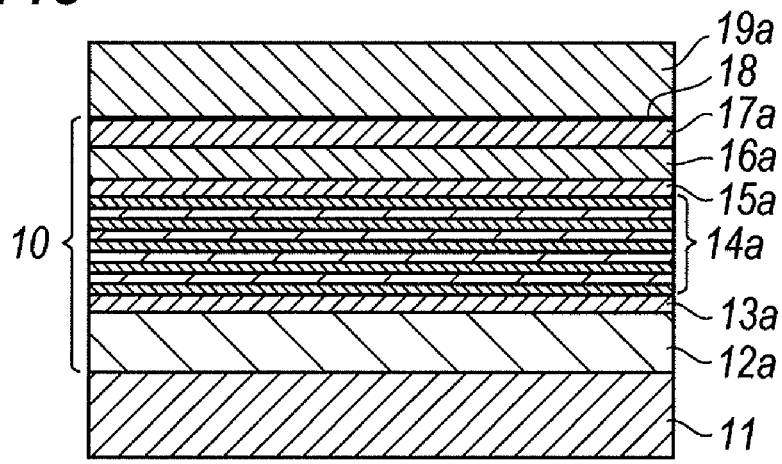

The process subsequently heat-treats the substrate 11 with the stack 10 in a furnace 100 at a temperature in a range from 100 to 400° C. under the presence of oxygen. For example, in this oxidization process, the substrate 11 with the stack 10 is processed in a furnace 100 for 5 minutes at 350° C. under the atmospheric ambience as shown in FIG. 1B. This heat treatment may positively convert a surface of the layer 17a, which is made of InGaAs, to form an oxidized layer 18 with a thickness in a range from 5 to 20 nm. In the embodiment described above, the thickness of the oxidized layer 18 is about 10 nm.

A conventional process of an LD possibly oxidizes a top surface of the grown layer when the n-type InP substrate with the stack thereon is took out from the growth furnace; that is, a native oxide layer may be unavoidably grown on the surface. However, a thickness of such native oxide layer is merely 1 to 2 nm. The oxide layer 18 according to the present process is formed by the positive heat treatment and has a thickness far greater than that of the native oxide layer.

Formation of Mask

The process next forms an insulating layer 19a on the stack 10, exactly on the oxide layer 18 of the stack 10. The insulating layer 19a may be made of silicon compound such as silicon die-oxide ($SiO_2$) grown by the plasma-enhanced chemical vapor deposition (hereafter denoted as p-CVD) technique. This p-CVD may use tetraethoxysilane (Si($OC_2H_4$), which is generally called as TEOS, as a silicon source, while, gaseous oxygen ($O_2$) as an oxygen source. The flow rate of the TEOS is set to be 11 sccm, while, that of the oxygen is set to be 300 sccm. The temperature of the n-type InP 11 substrate is set to be 600° C. These flow rates of the sources and the growth temperature depend on conditions of the furnace and the plasma generated therein. The thickness of the insulating layer 19a is about 1 μm.

Figure 2A:
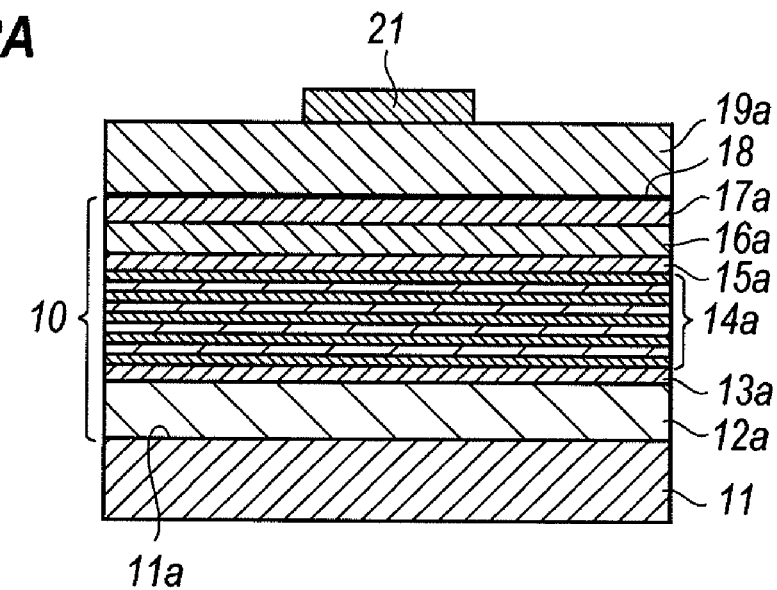
FIGS. 2A to 2C illustrate processes according to the first embodiment of the present invention, where they are subsequent to the process shown in FIG. 1C.
Figure 2B:
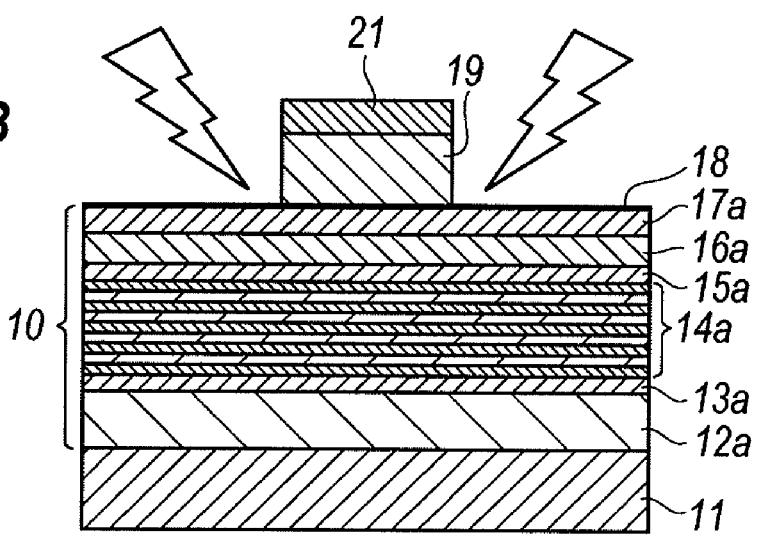
Figure 2C:
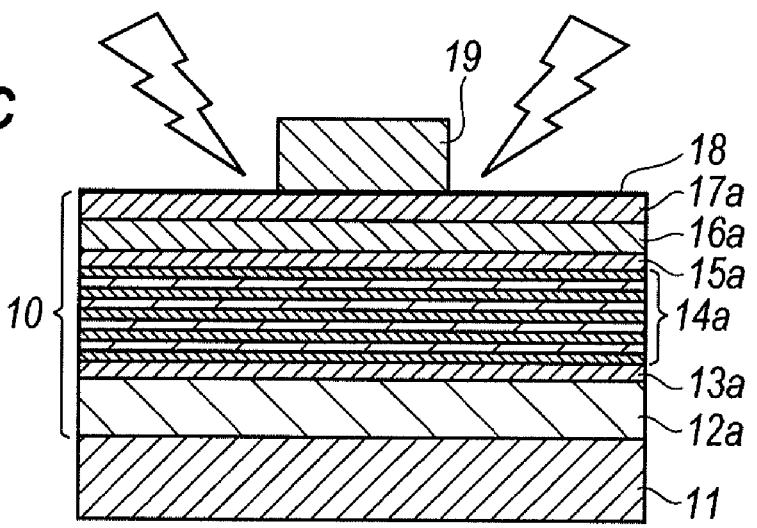

FIG. 2A shows a process to form a photoresist pattern 21 of the insulating layer 19a. This photoresist pattern 21 may be formed by a conventional photolithography technique. The pattern 21 has a striped shape extending along a predetermined direction of the primary surface 11a of the substrate 11. This predetermined direction corresponds to a direction along which light generated by the device propagates. FIG. 2A is a cross section taken in a surface perpendicular to this predetermined direction.

The process according to the present embodiment subsequently etches the insulating layer 19 by the pattern 21 as the etching mask to form the etching mask 19. A gas containing fluorine (F) such as trifluoromethane ($CHF_3$) may carry the dry-etching for the insulating layer 19a. The following is an example of the etching condition of the embodiment; however, precise conditions of the etching gas, its flow rate, and so on depends on various circumstances.

TABLE 1

| Etching conditions of insulating layer | |
|---|---|
| etchant: | $CHF_3$ 150 sccm |
| pressure: | 9.5 Pa |
| RF power: | 300 W |
| DC bias: | 50 W |
| etching rate: | ~80 nm/minute |

The striped photoresist patter 21 is removed after the etching by plasma-ashing under a condition of:

TABLE 2

| Plasma-ashing conditions | |
|---|---|
| etchant: | $O_2$ 200 sccm + $CF_4$ 6 sccm |
| pressure: | 10 Pa |
| RF power: | 300 W |
| DC bias | 0 W |
| time: | 3 minutes |

The plasma-ashing carried out in the present process may be distinguished in a sense that the present process is to remove the photoresist pattern 21; while, the conventional process is carried out to remove some residual fluorocarbons. Accordingly, a wet etching using a photoresist remover which is commercially available may substitute the plasma-ashing of the present embodiment. In this case using the photoresist remover may reduce the plasma damage caused in the semiconductor stack 10.

Formation of Mesa

Figure 3A:
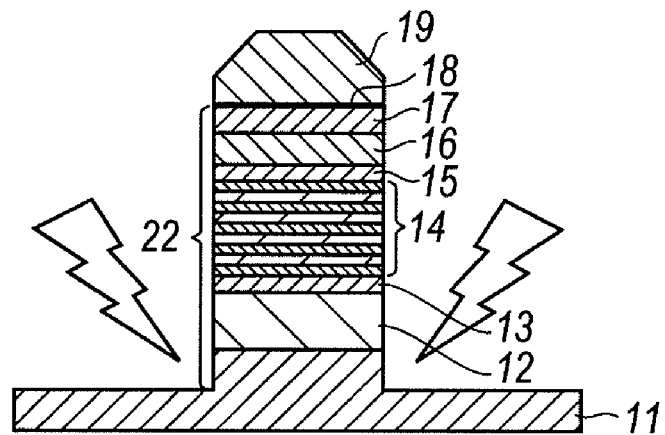
FIGS. 3A to 3C illustrate processes according to the first embodiment of the present invention, where they are subsequent to the process shown in FIG. 2C.

The process of the present embodiment forms the mesa 22 by etching the semiconductor stack 10 using thus processed etching mask 19 as shown in FIG. 3A. In this process, a plurality of semiconductor layers, 12a to 17a, involved in the stack 10 may be etched by the reactive ion etching (hereafter denoted as RIE) technique.

The dry-etching by the RIE technique may leave a protection layer in the sides of the mesa 22. Because the protection layer is one of residuals by the etching, it is preferable to remove them after the etching by the plasma-ashing described above for removing the photoresist pattern 21, but the plasma-asking carried out in this process is performed in order to remove residuals by the etching of the semiconductor materials. Iterating the dry-etching and the plasma-ashing by about 25 times in the same reaction chamber, the semiconductor mesa 22 with a steep side surface as shown in FIG. 3A may be obtained. The semiconductor mesa 22 includes the buffer layer 12, the lower optical confinement layer 13, the active layer 14, the upper optical confinement layer 15, the p-type cladding layer 16 and the cap layer 17, and has a height of about 2.2 μm.

The following table shows an exemplary condition of the dry-etching and the plasma-ashing:

TABLE 3

| Conditions of dry-etching and plasma-ashing | |
|---|---|
| Dry-etching | |
| etchant: | $CH_4$ 12.5 sccm + $H_2$ 37.5 sccm |
| pressure: | 1.5 Pa |
| RF power: | 200 W |
| DC bias: | 0 W |
| time: | 180 sec/cycle |
| Plasma-ashing | |
| etchant: | $O_2$ 80 sccm |
| pressure: | 1.5 Pa |
| RF power: | 300 W |
| DC bias: | 15 W |
| time: | 105 sec/cycle |

Under the conditions in Table 3, an etching rate for the semiconductor material is achieved to be about 65 nm/minutes.

Burying Mesa

Figure 3B:
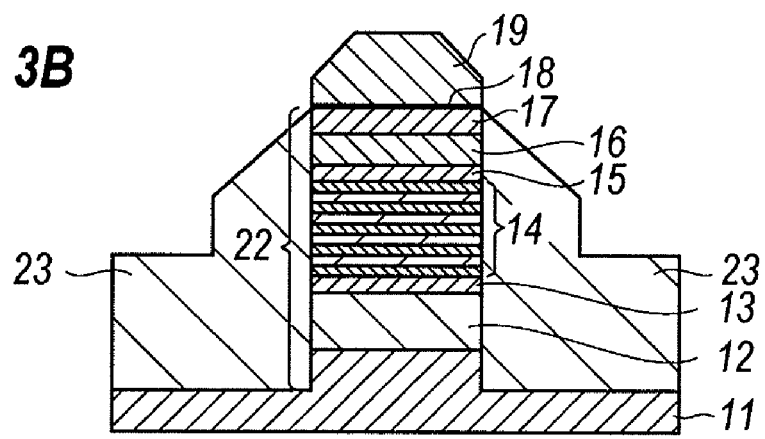
Figure 3C:
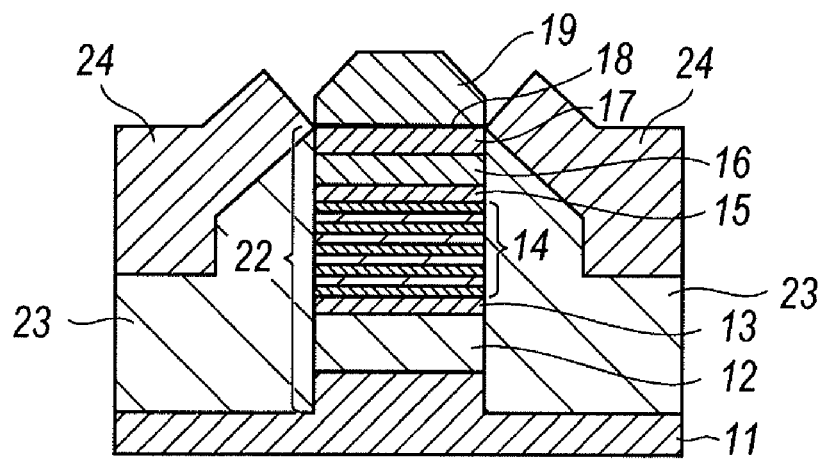
Figure 4A:
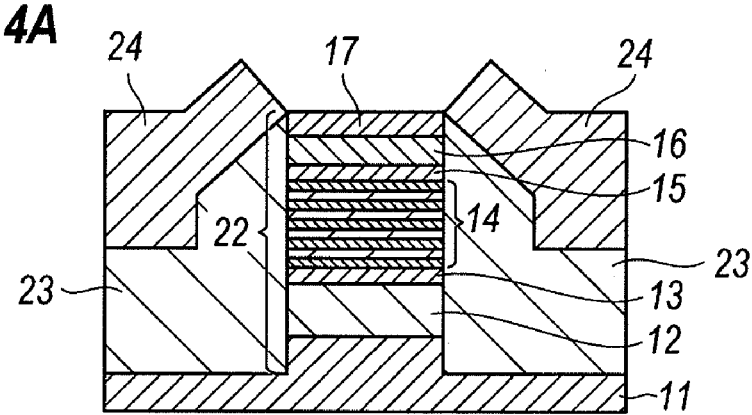
FIGS. 4A to 4C illustrate processes according to the first embodiment of the present invention, where they are subsequent to the process shown in FIG. 3C.

Next, the process grows a burying layer in both sides of the mesa 22. First, as shown in FIG. 3B, the process grows a Zn-doped InP layer for the p-type current blocking layer 23 by the etching mask 19 as a mask for the selective growth, which is a burying layer with the p-type conduction; subsequently, the process grows a Si-doped InP layer for the n-type current blocking layer 24 also by using the mask 19 as the selective growing mask, which is the burying layer with the n-type conduction (FIG. 3C). After the growth of both current blocking layers, 23 and 24, a wet-etching by fluoric acid may remove the mask 19, which is shown in FIG. 4A. This wet process by fluoric acid may remove the oxide layer 18 in the surface of the cap layer 17.

Growth of Additional Layers

Figure 4B:
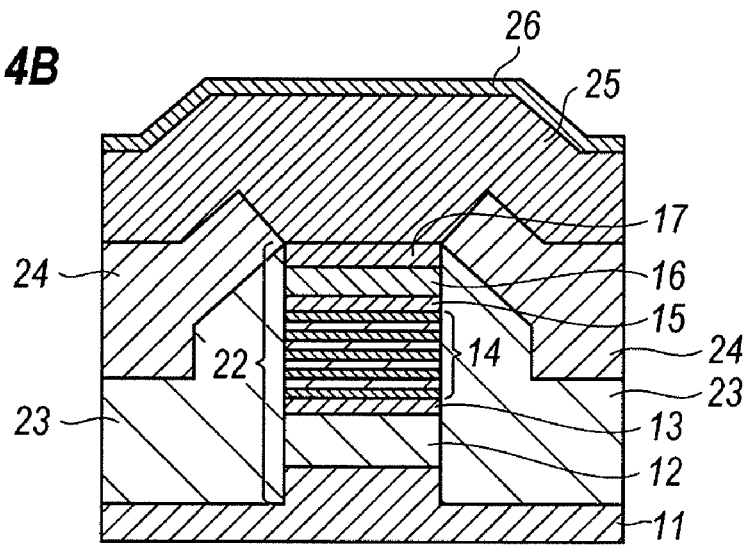

Next, the process according to the present embodiment may grow the p-type cladding layer 25 on the mesa 22 and the n-type current blocking layer 24, which is shown in FIG. 4B. This p-type cladding layer 25 may be a Zn-doped InP with a thickness of about 1.6 μm and a carrier concentration of $1.4 \times 10^{18}$ $cm^{-3}$. Then, the contact layer 26 is grown on the p-type cladding layer 25. The contact layer 26 may be made of Zn-doped InGaAs with a thickness of 0.5 μm and a carrier concentration of $1.5 \times 10^{19}$ $cm^{-3}$.

Figure 4C:
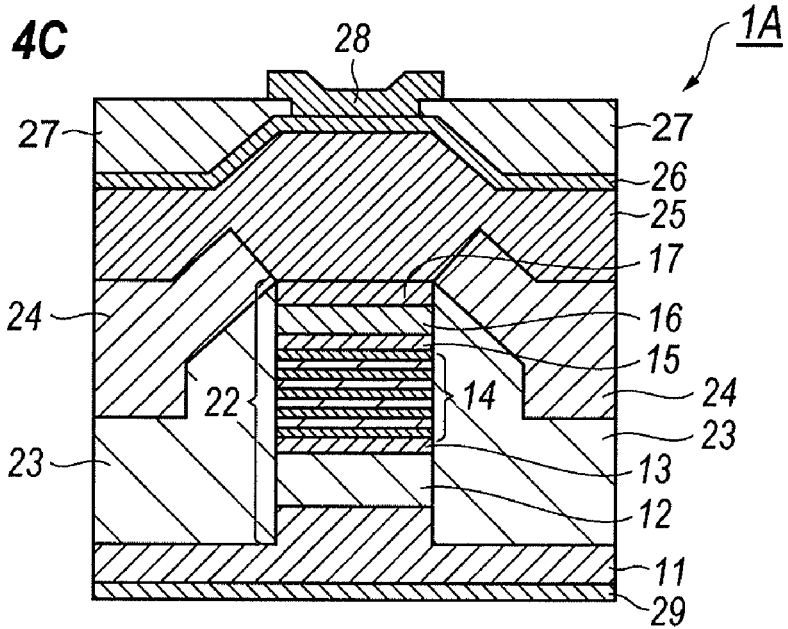

Subsequently, an insulating film 27 made of $SiO_2$ is formed on a whole surface with a window above the mesa 22. An anode electrode 28 made of eutectic metal of AuZn is provided on the insulating film 27 and within the window so as to come in contact with the contact layer 26, while, a cathode electrode 29 made of another eutectic metal of AuGe is deposited on the whole back surface of the n-type InP substrate 11. Splitting the substrate 11 into respective chips, the LD 1A according to the present invention may be completed (FIG. 4C).

The manufacturing process for the LD 1A according to the present embodiment forms the oxide layer 18 after the growth of the semiconductor stack 10, at which the present embodiment forms the oxide layer in the cap layer 17a. This oxide layer 18 will be exposed after the formation of the etching mask 19 shown in FIG. 2C and may react to an etchant containing fluorine, $CHF_3$ in the present embodiment, which may create fluorine compound with higher volatility such as carbonyl fluoride ($COF_2$). Thus, the residuals containing carbon fluoride (CF) may be reduced, which may result in shortening a time or in moderating the conditions of the plasma-ashing. Ultimately, the plasma-ashing may be cut from the process. Thus, the process according to the present embodiment may reduce the plasma damage affected to the semiconductor stack.

Preferably, a thickness of the oxide layer in the cap layer 17a may be equal to or thicker than 5 nm. For the oxide layer in the cap layer 17a with a thickness of less than 5 nm, fluorine compound such as carbonyl fluoride ($COF_2$) is not sufficiently created. Accordingly, the residuals containing carbon fluoride (CF) may be left on a surface of the semiconductor stack 10. On the other hand, a thickness of the oxide layer in the cap layer 17a may be preferably equal to or less than 20 nm. For the oxide layer in the cap layer 17a with a thickness of thicker than 20 nm, it is difficult to remove such a thick oxide layer.

It is necessary to carry out the plasma-ashing after the formation of the etching mask 19 for about 6 minutes in a conventional process, while, the present embodiment may shorten the time for the plasma-ashing to 3 minutes, which is about half of that in the conventional process. In order to evaluate the reduction of the plasma damage to the active layer 14, a photoluminescence was measured before and after the plasma-ashing, and the reduction rate of the magnitude of the photoluminescence was compared. The rate in the conventional process that carried out the plasma-ashing for 6 minutes reduced by about 20%; while, that in the present process reduced by only 6%, which clearly shows the plasma damage affected in the active layer 14 may be effectively reduced in the present process.

The existence of the oxidized layer 18 in the top of the semiconductor stack 10 may enhance the adhesion of the insulating layer 19a containing silicon to the semiconductor stack 10, which makes it hard to etch the sides of the mesa 22 and enhance the steepness of the side of the mesa 22 and the reproducibility of this steepness.

When a semiconductor material contains aluminum (Al), this semiconductor material becomes sensitive to the plasma damage. While, the LD 1A of the present embodiment provides the active layer made of semiconductor material containing Al, specifically, AlGaInAs. Even such arrangement, the active layer 14 of the present embodiment may be reduced from being affected by the plasma damage because the plasma-ashing time may be effectively reduced.

Moreover, the LD 1A of the present embodiment provides the semiconductor stack 10 with the top layer 17a thereof made of InGaAs. An InGaAs is likely to create residuals of carbon-fluoride when it is etched by an etchant containing fluorine. The oxide layer 18 of the present embodiment may effectively reduce the creation of the residuals of carbon-fluoride. Even the semiconductor stack 10 provides an InP as the top thereof, the oxide layer formed in this InP may reduce the residuals.

The insulating layer 19a of the present embodiment is made of silicon containing material, specifically, $SiO_2$. When an insulating material is made of $SiO_2$ or silicon nitride (SiN), an etchant containing fluorine is adequately applicable to carry out the dry-etching of the insulating layer 19a to form the etching mask for the mesa 22. The process to reduce the residuals of carbon-fluoride becomes effective in such dry-etching using the etchant containing fluorine. When the etchant contains fluorine (F), carbon (C) and hydrogen (H), such as $CHF_3$ of the present embodiment, the residuals of carbon-fluoride are quite easily created. The process of the present embodiment to reduce the creation of such residuals becomes further effective.

Second Embodiment

A manufacturing process according to another embodiment of the present invention will be described as referring to FIGS. 5A to 6B. Processes according to the first half until the formation of the etching mask 19, which includes the oxidization of the top of the semiconductor stack 10, are same as those of the first embodiment.

Formation of Mesa

Figure 5A:
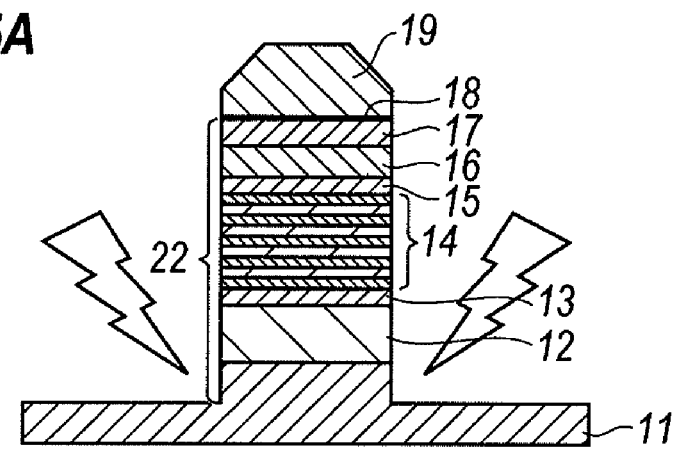
FIGS. 5A to 5C illustrate processes according to the second embodiment of the present invention, where they are subsequent to the process shown in FIG. 2C.

The mesa 22 may be formed by the dry-etching using the partially etched insulating layer 19 as the etching mask, as shown in FIG. 5A. The conditions of the dry-etching are same as those shown in table 3, but the p-type cap layer made of InGaAs in the top of the mesa 22 may operate as the contact layer in the present embodiment.

Burying Mesa

Figure 5B:
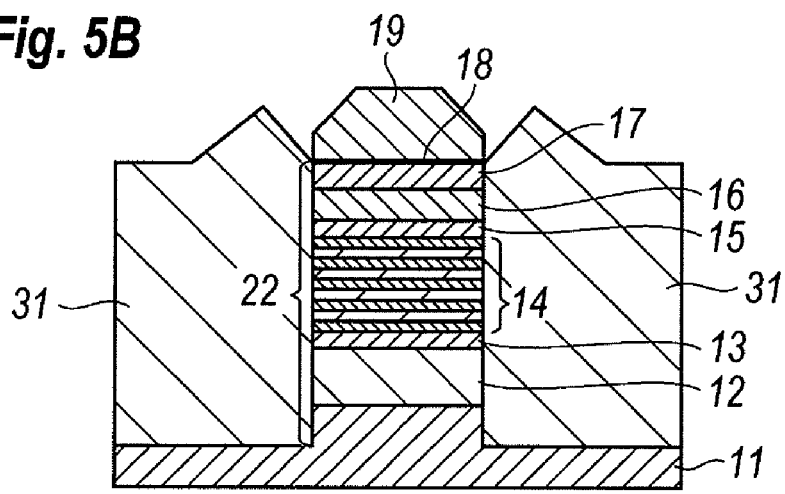
Figure 5C:
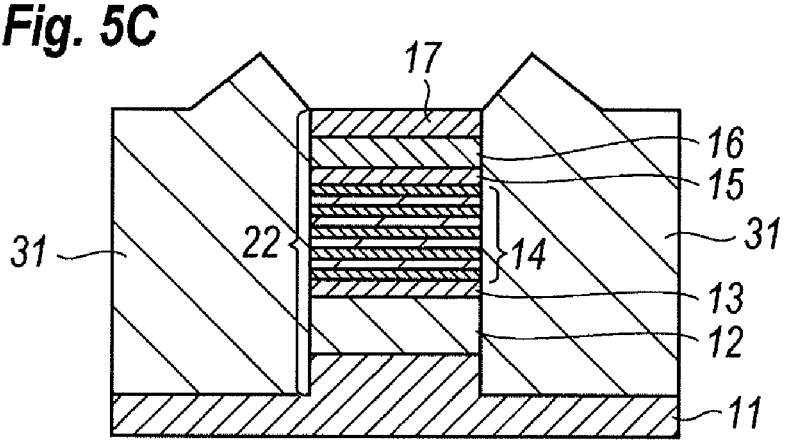
Figure 6A:
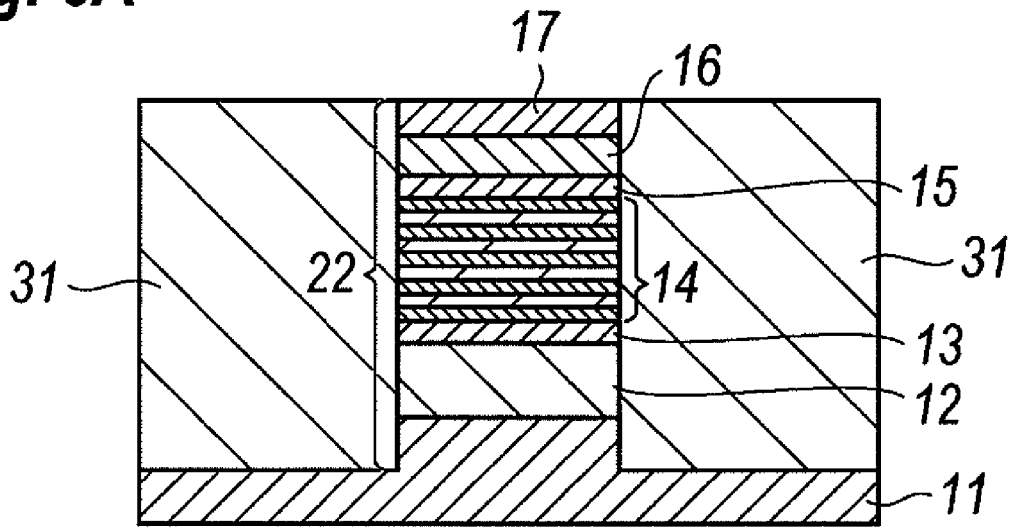
FIGS. 6A and 6B illustrate processes according to the second embodiment of the invention, where they are subsequent to the process shown in FIG. 5C.

As shown in FIG. 5B, the burying layer 31 is selectively grown on both sides of the mesa 22 by the insulating mask 19 as the growth mask, where the burying layer 31 may be made of iron-doped InP that shows a semi-insulating characteristic. The burying layer 31 may operate as the current blocking layer. The insulating layer 19 as the growth mask is removed after the growth by the fluoric acid, as shown in FIG. 5C. The oxide layer 18 in the top of the cap layer 17 may be simultaneously removed. After the removal of the insulating layer 19, the surface of the current blocking layer 31 and that of the mesa 22 are processed in flat as shown in FIG. 6A by the wet etching.

Figure 6B:
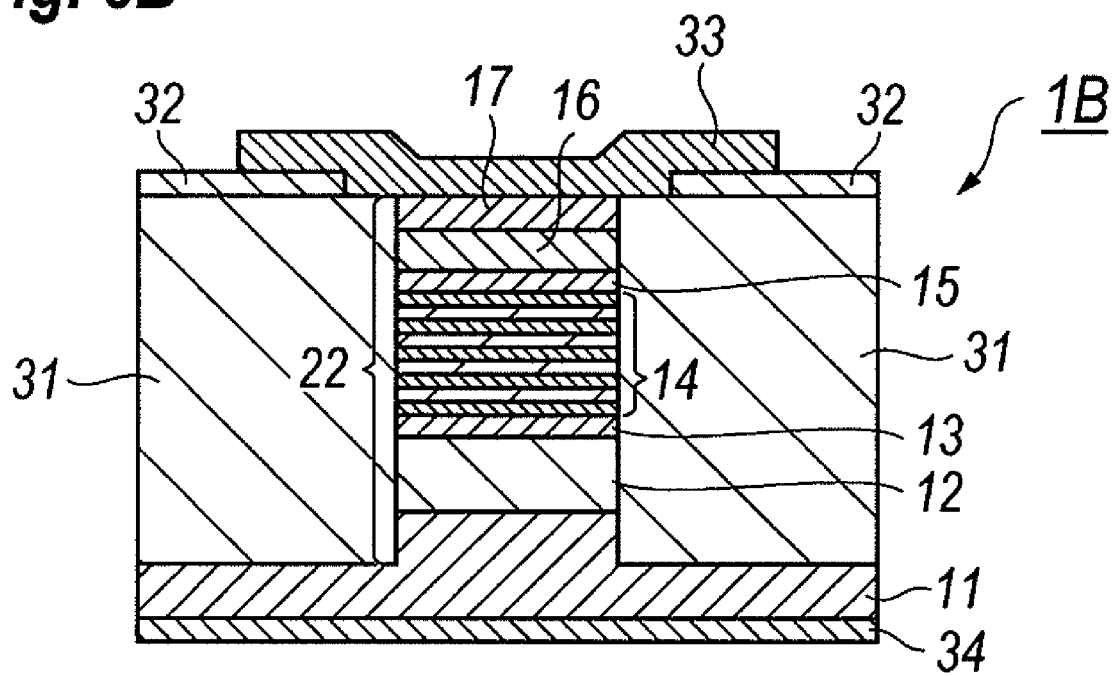

Finally, another $SiO_2$ layer 32 covers the flattened surface of the mesa 22 and the current blocking layer 31 except a region above the mesa 22 by the window. The anode electrode 33 is filled within the window of the $SiO_2$ film 32 so as to come in contact with the cap layer 17, and the cathode electrode is deposited in the whole back surface of the substrate 11. Thus, the LD 1B according to the second embodiment of the present invention may be completed as shown in FIG. 6B. The anode electrode may be made of AuZn, while, the cathode electrode may be made of AuGe, which are same as those in the first embodiment.

The process for the LD 1B according to the second embodiment forms the oxide layer 18 in the top of the semiconductor stack 10 same as those in the first embodiment. Accordingly, the process of the invention may reduce the residuals of carbon-fluoride created during the formation of the etching mask made of inorganic material containing Si, and effectively reduce the etching damage induced in the plasma-ashing.

Although the present invention has been fully described in conjunction with the preferred embodiment thereof with reference to the accompanying drawings, it is to be understood that various changes and modifications may be apparent to those skilled in the art. Such changes and modifications are to be understood as included within the scope of the present invention as defined by the appended claims, unless they depart therefrom.

What is claimed is:

1. A method to manufacture a semiconductor device, comprising steps of:
   growing a semiconductor layer made of at least one of InP and InGaAs on a semiconductor substrate;
   oxidizing said semiconductor layer;
   covering said semiconductor layer by an inorganic material containing silicon;
   forming a striped mask in said inorganic material including steps of,
      dry-etching said inorganic material by an etchant containing fluorine (F) using a photoresist pattern as an etching mask, and
      plasma-ashing said photoresist pattern; and
   etching said semiconductor layer using said striped mask of said inorganic material, wherein said step of oxidizing includes a step of heat-treating said semiconductor layer in an atmosphere containing oxygen.

2. The method of claim 1,
wherein said etchant to dry-etch said inorganic material includes fluorine (F), carbon (C) and hydride (H).

3. The method of claim 2,
wherein said etchant is trifluoromethane ($CHF_3$).

4. The method of claim 1,
wherein said plasma-ashing is carried out by an etchant of a mixture of oxygen ($O_2$) and carbon tetra fluoride ($CF_4$).

5. The method of claim 1,
wherein said step of heat-treating said semiconductor layer is carried out under a temperature in a range from 100 to 400° C.

6. The method of claim 1,
wherein said step of oxidizing oxidizes a surface of said semiconductor layer to form an oxidized layer with a thickness from 5 to 20 nm.

7. A method to manufacture a semiconductor laser diode with a ridge waveguide structure, comprising steps of:
(a) growing a semiconductor stack including a plurality of semiconductor layers on a semiconductor substrate made of InP;
(b) oxidizing said semiconductor stack by heat-treating said semiconductor stack in an atmosphere containing oxygen to form an oxidized layer;
(c) forming a striped mask made of inorganic material containing silicon (Si) on said semiconductor stack by steps of,
(c-1) dry-etching said inorganic material by an etchant containing fluorine using a photoresist pattern as an etching mask, and
(c-2) plasma-ashing said photoresist pattern;
(d) iterating dry-etching said semiconductor stack and subsequent plasma-ashing alternately using said striped mask to form said ridge waveguide structure in said semiconductor stack; and
(e) burying said ridge waveguide structure by a burying layer.

8. The method of claim 7,
wherein said etchant to dry-etch said inorganic material includes fluorine (F), carbon (C) and hydride (H).

9. The method of claim 8,
wherein said etchant is trifluoromethane ($CHF_3$).

10. The method of claim 7,
wherein said plasma-ashing is carried out by an etchant of a mixture of oxygen ($O_2$) and carbon tetra fluoride ($CF_4$).

11. The method of claim 7,
wherein said step of oxidizing includes a step of heat-treating said semiconductor stack at a temperature in a range from 100 to 400° C.

12. The method of claim 7,
wherein the oxidized layer has a thickness from 5 to 20 nm.

13. The method of claim 7,
wherein said step of growing said semiconductor stack includes a step of growing an active layer containing aluminum (Al).

14. The method of claim 13,
wherein said step of growing said semiconductor stack further includes a step of growing optical confinement layers putting said active layer therebetween.

15. The method of claim 7,
wherein said step of growing said semiconductor stack includes a step of growing a cap layer made of at least onveof InP and InGaAs, and
wherein said step of oxidizing said semiconductor stack includes a step to oxidize a surface of said cap layer.

16. The method of claim 7,
wherein step of dry-etching and plasma-ashing iterated alternately to form said ridge waveguide structure is carried out by varying reactive gases and plasma conditions in a same reaction chamber.

17. The method of claim 16,
wherein said step of dry-etching and plasma-ashing iterated alternately is iterated at least 25 times to etch said semiconductor stack by at least 2.2 μm.

18. The method of claim 7, further comprising steps of, after said step (e):
wet-etching said oxidized layer by fluoric acid, and
forming an electrode on said ridge waveguide structure.

* * * * *